United States Patent [19]

Brandenburger

[11] Patent Number: 5,079,040
[45] Date of Patent: Jan. 7, 1992

[54] PROCESS FOR ELECTROLESSLY DEPOSITING NICKEL

[75] Inventor: Jürgen Brandenburger, Selb, Fed. Rep. of Germany

[73] Assignee: Hoechst CeramTec Aktiengesellschaft, Selb, Fed. Rep. of Germany

[21] Appl. No.: 393,893

[22] Filed: Aug. 15, 1989

[30] Foreign Application Priority Data

Aug. 17, 1988 [DE] Fed. Rep. of Germany ....... 3827893

[51] Int. Cl.⁵ .............................................. C23C 26/00
[52] U.S. Cl. .................... 427/305; 427/304; 427/438
[58] Field of Search .................. 427/304, 305, 438

[56] References Cited

U.S. PATENT DOCUMENTS

| | | | |
|---|---|---|---|
| 3,414,427 | 12/1968 | Levy | 427/305 |
| 3,690,921 | 9/1972 | Elmore | 427/305 |
| 3,857,733 | 12/1974 | Arnold | 117/212 |
| 4,440,571 | 4/1984 | Ishikawa | 427/438 |
| 4,604,299 | 8/1986 | DeLuca | 427/304 |
| 4,746,375 | 5/1988 | Iacovangelo | 148/20.3 |

FOREIGN PATENT DOCUMENTS

| | | | |
|---|---|---|---|
| 6505820 | 5/1965 | Netherlands | 427/304 |
| 2169004 | 7/1986 | United Kingdom | 427/304 |

OTHER PUBLICATIONS

M. M. Haddad et al., "Activation of Catalyst for Electroless Plating on Molybdenum" IBM Technical Disclosure Bulletin, vol. 19, No. 3, Aug. 1976, p. 929.
A. F. Schmeckenbecher, "Electroless Nickel–Tin Process" IBM Technical Disclosure Bulletin, vol. 19, No. 3, Aug. 1976, p. 928.

Primary Examiner—Shrive Beck
Assistant Examiner—Vi Duong Dang
Attorney, Agent, or Firm—Foley & Lardner

[57] ABSTRACT

To electrolessly depositing nickel on tungsten surfaces or molybdenum surfaces which have been deposited on surfaces of ceramic bodies, the ceramic bodies are nucleated, preferably after thorough cleaning, for example with aqueous hydrofluoric acid, by immersion in an aqueous solution containing palladium ions and then introduced into an electroless nickel-plating bath. Before the nickel-plating, the nucleated ceramic bodies are treated in a bath containing a complexing agent for palladium ions, for example in an aqueous cyanide solution.

15 Claims, No Drawings

PROCESS FOR ELECTROLESSLY DEPOSITING NICKEL

DESCRIPTION

The present invention relates to a process for electrolessly depositing nickel on tungsten surfaces or molybdenum surfaces, which have been deposited on the surfaces of ceramic bodies, without a nickel-plating of the ceramic surface occurring. In particular, the invention relates to a process for electrolessly depositing nickel on tungsten or molybdenum in the case of ceramic substrates and housings for integrated circuits.

Metalized ceramic substrates, for example of aluminum oxide, are frequently used for power semiconductors. The metalization of these substrates is generally composed of tungsten or molybdenum. A nickel-plating of these metal surfaces is necessary to improve the solderability of the parts. The nickel may be electrodeposited. For cost reasons, however, the electroless deposition of nickel is frequently more advantageous since in this case the expensive mounting of the parts on the frame and making contact to individual surfaces is unnecessary. A further technical disadvantage of nickel electroplating is that no metal is deposited at the contact point. If, on the other hand, making contact is dispensed with and the electroplating of nickel is carried out in a drum containing contact material, the surface may be scratched, breakage may occur and the deposition may take place in a non-uniform layer thickness.

In the case of housings for integrated circuits which have ceramic/metal joints, an electroless deposition of nickel is often desirable since, for example, short circuit connections (for supplying current) must not be created.

Processes for electrolessly depositing nickel have frequently been described; cf. for example, Hermsdorfer Technische Mitteilungen 47/1977, pages 1496-1499; E. G. Gawrilov, "Chemische Vernickelung" ("electroless nickel plating"), published by Leutze-Verlag, Saulgau (Würtemberg), 1974; DD-PS 215,588.

These processes are suitable for electrolessly depositing nickel on metals, also on tungsten or molybdenum. A disadvantage is, however, that, in the case of metal/ceramic systems, although the nickel deposits very well on the metal, it deposits partly also on the ceramic: in the case of the known nucleation with palladium, for example $PdCl_2$ solutions, nuclei adhere to the metallization and also to pores, edges (for example, punched or laser-cut edges) or particle boundaries of the ceramic, which results, in the nickel bath, in the nickel-plating also of non-metallic points. This is undesirable since for electronic purposes, in particular for substrates and housing for integrated circuits, the ceramic is intended to act as insulator between metal surfaces.

This effect occurs, in particular, in the case of dark-colored $Al_2O_3$ ceramics which may contain free metals, such as, for example, molybdenum or tungsten, in very finely divided form. Such ceramics are required, in particular, as housings for integrated circuits.

There was therefore the object of providing a process with which the surface of ceramic bodies is not metallized in the electroless nickel-plating of tungsten or molybdenum surfaces.

A process has now been found for electrolessly depositing nickel on tungsten surfaces or molybdenum surfaces which have been deposited on the surface of ceramic bodies, in which process the ceramic bodies are nucleated by immersion in aqueous solutions containing palladium(II) ions and it is then introduced into an electroless nickel-plating bath. This process comprises treating the nucleated ceramic bodies in a bath containing a complexing agent for palladium(II) ions before nickel plating.

Suitable complexing agents for palladium ions, which act as denucleators, are, in particular, aqueous solutions which contain cyanide ions, for example a 0.05-0.5%, in particular 0.08-0.12%, solution of sodium cyanide. Immersion times of 1-5 min are adequate. Nucleating baths containing Pd ions and nickel-plating baths are also available commercially.

Advantageously, the surface of tungsten or molybdenum is first freed from oxides which are always present under normal conditions and impede the deposition of other metals. The oxides may be removed, for example, chemically by means of sodium hydroxide or, preferably, thermally in a reducing atmosphere at temperatures above 600° C. In particular, the oxides can be removed under conditions in which the layer of tungsten or molybdenum has been fired in on the ceramic. The advantageous effect of this reduction treatment is, however, lost again on standing for several hours in air.

Furthermore, a standard degreasing of the metallized ceramic is advisable before nucleation. Subsequently, the ceramic can be pickled with acidic chemicals in order to complete the cleaning.

Tungsten or molybdenum are usually fired into the ceramic using a silicate paste. The continuous glass phase produced during the sinter firing acts also as adhesion between metal and ceramic. If the proportion of glass has been chosen too high and the metal particles at the surface are encased in glass, it is advantageous to remove the glass at the surface without weakening the metal/ceramic composite. For this purpose, the ceramic may be treated with hydrofluoric acid or aqueous acidic fluoride-containing solutions. The concentration of such solutions is preferably 0.5 to 20% by weight of HF.

In order to render the subsequent nucleation more reliable, the ceramic is preferably immersed in a bath containing an organic amine. In particular, aliphatic hydroxylamines, such as triisopropanolamine in a solvent such as isopropyl alcohol can be used. Solutions containing such additives are available commercially as "conditioners".

The actual nucleation with palladium(II) solutions is then carried out. Here, care should be taken to ensure that the palladium salt is dissolved. This is undoubtedly the case at pHs below 5, preferably below 4, especially below 3. In order to keep the nucleation of the ceramic low, the chosen concentration of palladium in the nucleating solution should be low. Concentrations below 0.1% Pd, in particular of 0.01 to 0.08% Pd, are advantageous.

The nucleation with palladium is followed by the denucleation by means of complexing agents.

This is followed by a standard electroless nickel plating, for example, from nickel-phosphorus baths, and a standard post-treatment.

Adequate rinsing should be ensured between all the active baths described here.

The process according to the invention makes it possible to reliably provide ceramic products of forsterite, zirconium oxide and, in particular, aluminum oxide which includes at least 95% $Al_2O_3$, such as, for example, metallized substrates or housings for integrated circuits, with nickel at the metallic surfaces on an industrial scale, without the ceramic being nickel-plated. The invention is explained in more detail by the example.

ILLUSTRATIVE EXAMPLE

Metallized substrate composed of 96% $Al_2O_3$ having tungsten surfaces which were deposited by screen printing (for example, multiple substrate subdivided by laser grooves).

| | | | |
|---|---|---|---|
| 1. Thermal pretreatment: 1080° C., 10 min, $H_2$ atmosphere | | | |
| 2. Degreasing bath | 60–80° C. | 5 min | |
| 3. Pickling: 18% by weight HCl in water | 20° C. | 30 sec | |
| 4. Hydrofluoric acid, 3% in water | 20° C. | 1 min | |
| 5. Conditioner, 10% | 20° C. | 1 min | |
| 6. $PdCl_2$, 0.01% Pd in water | 40° C. | 1–5 min | |
| 7. Denucleator | 20° C. | 1–5 min | |
| 8. Electroless nickel bath | 80° C. | 10 min | |

The metallization is perfectly nickel-plated. The $Al_2O_3$ surfaces remain clean.

I claim:

1. A process for electrolessly depositing nickel on tungsten or molybdenum surfaces, which have been deposited on the surface of a ceramic body, substantially without also depositing nickel on the ceramic body surface, the process comprising the steps of:
   (a) immersing the ceramic body in a nucleating aqueous solution which includes palladium ions;
   (b) treating the resultant nucleated ceramic body in a separate bath containing a complexing agent for palladium ions; and then
   (c) introducing the resultant treated ceramic body into an electroless nickel-plating bath.

2. The process as claimed in claim 1, wherein said complexing agent comprises an aqueous cyanide solution.

3. The process as claimed in claim 1, further comprising removing oxide films from said tungsten or molybdenum surfaces by reduction prior to step (a).

4. The process as claimed in claim 1, further comprising degreasing said ceramic body prior to step (a).

5. The process as claimed in claim 4, further comprising treating the resultant degreased ceramic body in an acidic pickling bath prior to step (a).

6. The process as claimed in claim 1, wherein said ceramic body consists essentially of aluminum oxide.

7. The process as claimed in claim 1, further comprising treating said ceramic body with aqueous hydrofluoric acid prior to step (a).

8. The process as claimed in claim 1, further comprising immersing said ceramic body in a bath containing an organic amine, prior to step (a).

9. The process as claimed in claim 1, wherein step (a) is carried out at a pH below 5.

10. The process as claimed in claim 1, wherein the amount of palladium in the nucleating solution does not exceed 0.1% by weight.

11. The process as claimed in claim 2, wherein said aqueous cyanide solution contains 0.05 to 0.5% of sodium cyanide.

12. The process as claimed in claim 11, wherein said aqueous cyanide solution contains 0.08 to 0.12% of sodium cyanide.

13. The process as claimed in claim 1, wherein step (b) is carried out in about 1 to 5 minutes.

14. The process as claimed in claim 6, wherein said aluminum oxide contains at least 95% $Al_2O_3$.

15. The process as claimed in claim 1, wherein the palladium ions used in step (a) comprise palladium (II) ions.

* * * * *